United States Patent [19]

Okubo

[11] 4,314,202
[45] Feb. 2, 1982

[54] FLEXURAL VIBRATION SENSOR WITH MAGNETIC FIELD GENERATING AND SENSING

[76] Inventor: Shigeo Okubo, 350 Sharon Park Dr., Apt. E24, Menlo Park, Calif. 94025

[21] Appl. No.: 963,476

[22] Filed: Nov. 24, 1978

[30] Foreign Application Priority Data

Aug. 7, 1978 [JP] Japan .................... 53-95474

[51] Int. Cl.³ .................. G01H 11/00; G01B 7/14; G01R 33/02
[52] U.S. Cl. ...................... 324/207; 73/658; 324/174; 324/228; 336/110
[58] Field of Search .................. 324/207–209, 324/228, 229, 230, 231, 232, 239, 240–243, 219–221, 173, 174, 150, 151 R, 154, 234, 238; 73/661, 658, 519; 335/229, 230; 336/110

[56] References Cited

U.S. PATENT DOCUMENTS

| | | | |
|---|---|---|---|
| 1,163,070 | 12/1915 | Day | 324/150 UX |
| 2,116,119 | 5/1938 | Loewenstein | 324/229 |
| 2,226,275 | 12/1940 | Abbott et al. | 324/229 |
| 2,558,427 | 6/1951 | Fagan | 324/221 X |
| 2,717,039 | 9/1955 | Gieske | 324/221 X |
| 2,944,213 | 7/1960 | Foerster | 324/229 X |
| 3,007,109 | 10/1961 | Swift | 324/221 |
| 3,371,272 | 2/1968 | Stanton | 324/207 |
| 3,477,280 | 11/1969 | Blackmer | 73/661 |
| 3,504,320 | 3/1970 | Engdahl et al. | 335/229 X |
| 3,676,765 | 7/1972 | Westcott | 324/174 X |
| 3,680,379 | 8/1972 | Boyd et al. | 324/174 X |
| 3,942,045 | 3/1976 | Palazzetti | 324/174 X |
| 4,045,738 | 8/1977 | Buzzell | 335/229 X |

FOREIGN PATENT DOCUMENTS 52-45953 12/1977 Japan .................. 324/207

*Primary Examiner*—Gerard R. Strecker
*Attorney, Agent, or Firm*—Townsend and Townsend

[57] ABSTRACT

A flexural vibration sensor including a housing fabricated from a magnetizable material for providing an internal magnetic path and having a coupling surface for contact with an associated structural member; electrically conductive coil means positioned within the housing; and means for generating a magnetic field within the internal magnetic path, through the coil means and along the coupling surface in the region exterior to the housing so that variations in the strength of that portion of the magnetic field in the region exterior to the housing caused by flexural vibration of the associated structural member when the sensor is attached thereto are sensed by the electrically conductive coil means and manifested by a variable electrical signal.

7 Claims, 4 Drawing Figures

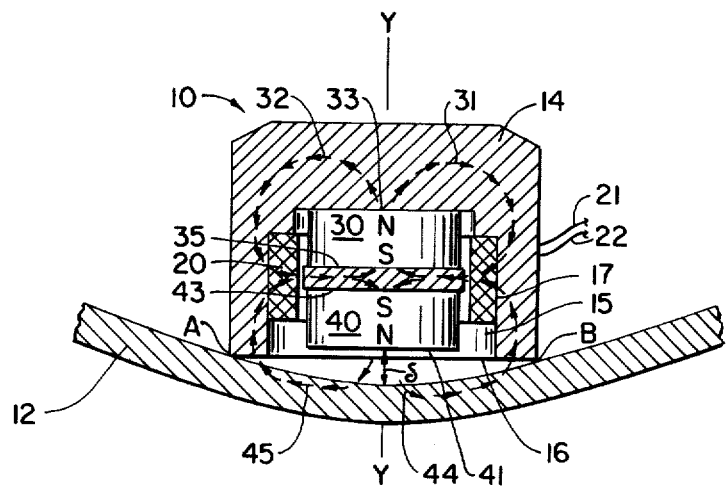
FIG._1.
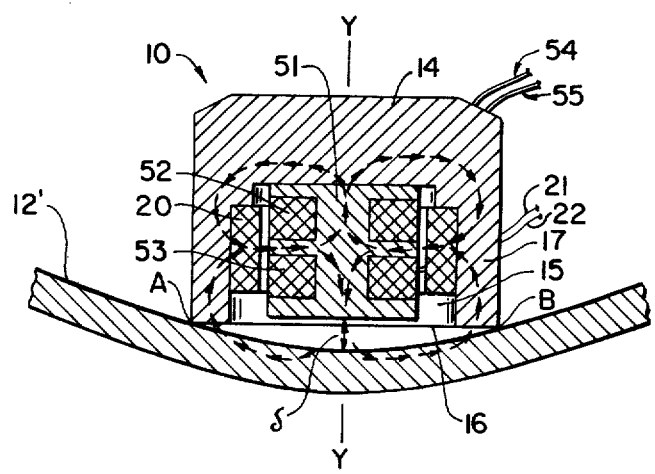
FIG._2.

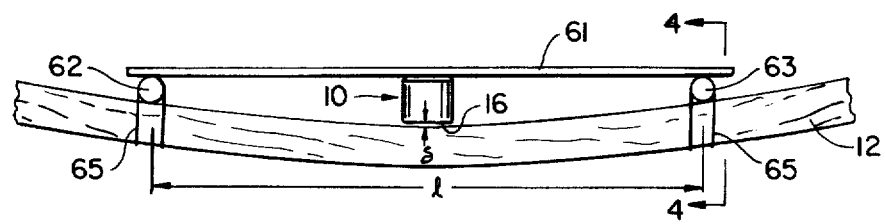
FIG._3.
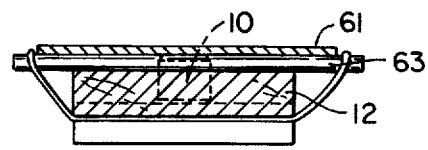
FIG._4.

FLEXURAL VIBRATION SENSOR WITH MAGNETIC FIELD GENERATING AND SENSING

BACKGROUND OF THE INVENTION

This invention relates to sensing devices for measuring the flexural vibration of structural members.

Many sensors are known which are used to measure the flexural vibration of structural members. Examples of such sensors are strain gauges, pressure transducers, linear motion detectors, and other comparable devices. Most known sensors suffer from one or more disadvantages which renders each type of transducer unsuitable for a wide variety of uses. For example, many transducers depend upon relative motion between moving parts and consequently possess inherent mechanical resonances which must be accounted for, either by way of initial design considerations (e.g., mass, relative dimensions, spring constants and the like) or by the use of output signal filtering devices usually of the electrical type and incorporated into the measuring instrumentation. Other devices are sensitive to more than one mode of vibration and provide measurement signals containing both flexural vibration and rigid body vibration components. When used to measure flexural vibrations of the structural member to which the sensor is designed to be attached, additional provisions must be made to cancel out the effect of the measurement signal components corresponding to the non-flexural modes of vibration. Typically, this entails the use of another sensor which is only sensitive to the non-flexural modes of vibration, or the use of specially designed electronic measuring circuitry capable of nulling out or at least substantially filtering these undesired measurement signals. Other sensors are directional in nature and thus require extensive care in installation to ensure that the axis of maximum sensitivity is oriented along the direction of the expected flexural vibrations in the associated structural member. Still other devices are temperature sensitive and require either temperature compensation or the use of an additional temperature sensing device closely adjacent thereto to monitor the thermal environment and provide correction signals for the measurement signals produced by the sensor. Still other devices are relatively complicated to construct, test and/or calibrate; while many sensors are difficult to attach to the structural member to be monitored, frequently requiring the use of expensive attachment fixtures. Most known sensors combine several of these disadvantages.

SUMMARY OF THE INVENTION

The invention comprises a flexural vibration sensor which is devoid of the above-noted disadvantages, which is extremely simple in design and operation, and which may be employed in a broad range of applications.

The sensor includes a housing fabricated from a magnetizable material, preferably soft iron, for providing an internal magnetic path, the housing having a coupling surface for contact with an associated structural member; electrically conductive coil means positioned within the housing; and means for generating a magnetic field within the internal magnetic path, through the coil means and along the coupling surface in the region exterior to the housing; so that vibrations in the strength of that portion of the magnetic field in the region exterior to the housing caused by flexural vibration of the associated structural member when the sensor is attached thereto are sensed by the electrically conductive coil means and manifested by a variable electrical signal.

The housing is geometrically symmetric about an axis normal to the coupling surface, the symmetry being preferably cylindrical. In the preferred cylindrical geometry, the coil means is also cylindrical, and is secured in a cavity within the housing, the coil and housing having a common geometrical axis.

The magnetic field generating means, which may comprise either permanent magnets or electromagnets, generates a pair of toroidal magnetic field regions: A first region extending from a first pole, through an upper portion of the internal magnetic path, through the coil means and to an opposite pole to form a first closed path; the second region extending from a bottom pole, along the exterior region, through a lower portion of the internal magnetic path, through the coil means to the opposite pole associated to this second region. The first and second magnetic field regions have centers which define an axis coincident with the geometrical axis of the housing and coil means. The pole face of the lowermost pole within the housing is recessed from the coupling surface so that a gap is formed when the sensor is attached to the associated structural member. In this manner, flexural vibrations of the structural member cause the length of the gap to vary, thereby changing the reluctance of the lower magnetic path and causing the magnetic field strength variations sensed by the coil means.

Since the sensor contains no moving parts there are no internal resonances to cause perturbations on the measurement signals generated by the coil in response to flexural vibrations. Due to the simplicity of the design, the sensor is virtually noise free and temperature insensitive. The sensor is self-adhering to any magnetizable structural member; for non-magnetizable structural members, a thin sheet of magnetizable material having a stiffness substantially less than the stiffness of the structure may be simply adhered to the structural member by means of a suitable adhesive. In some applications (discussed infra) in which measurement of the acceleration of a non-magnetizable structural member is desired, the sensor may be simply adhered to the surface of the structural member using epoxy resin or some other suitable adhesive.

Due to the symmetry geometry of the sensor, the device is omnidirectional in the plane of the contact surface and thus self-aligning. Also, the sensor may be employed with many different structural member geometries, with the geometry of the structural member determining the direction of the major bending mode. Also, the magnetizable housing acts as a shield against stray electromagnetic radiation, which contributes to the noise immunity of the device.

Once installed, any flexural vibration of the structural member causes the strength of the magnetic field flowing through the coil means within the housing to vary. When attached to a magnetizable structural member, or a non-magnetizable structural member on which a magnetizable contact layer has been previously applied, the current induced in the coil means is proportional to the velocity of vibration of the structural member. When attached to a non-magnetizable metal structural member, interaction of the lower magnetic field with the structural member produces eddy currents within the latter whose magnetic fields in turn interact with the lower magnetic field, with the result that the current induced in the coil means is proportional to the acceleration of the flexural vibration of the structural member.

Calibration of the sensor after attachment to the structural member may be easily accomplished using several alternative techniques. Such techniques include dropping a known weight on the structural member and observing the electrical output signals from the sensor coil means; striking the member with an instrumented hammer and obtaining the transfer function of the sensor-structural member combination; or calibrating the coil signals produced by the sensor in response to various flexural vibrations by means of a separate calibration sensor.

The sensor may be tuned to respond to vibrations of different frequencies by varying the diameter of the contact surface. To measure extremely low frequencies (long wave lengths) of flexural vibration, the sensor is adhered to an elongate adaptor member, the adaptor member having a pair of longitudinally spaced suspension contacts straddling the sensor housing, each suspension contact adapted to be placed in surface contact with the associated structural member. The stiffness of the adaptor member is selected to be substantially greater than the stiffness of the associated structural member.

For a fuller understanding of the nature and advantages of the invention, reference should be had to the ensuing detailed description taken in conjunction with the accompanying drawings.

BRIEF DESCRIPTION OF THE DRAWINGS

FIG. 1 is a longitudinal sectional view of a first embodiment of the invention;

FIG. 2 is a view similar to FIG. 1 showing an alternate embodiment of the invention;

FIG. 3 is a schematic elevational view illustrating use of the invention with an adaptor member; and FIG. 4 is a sectional view taken along lines 4—4 of FIG. 3.

DESCRIPTION OF THE PREFERRED EMBODIMENTS

Turning now to the drawings, FIG. 1 is a longitudinal sectional view illustrating a first embodiment of the invention. As seen in this figure, a sensor generally designated by reference numeral 10 is placed in surface contact at points A and B with a structural member 12, such as a beam in a building, illustrated in a flexed position. It should be understood that the magnitude of the flexure of member 12 is greatly exaggerated in FIG. 1 for illustrative purposes only.

Sensor 10 includes a housing 14 having right circular cylindrical geometry along axis Y—Y and including a recess generally designated by reference numeral 15. Housing 14 may be fabricated from any easily magnetizable material, preferably soft iron, and terminates in a contact surface 16.

Secured to the inner wall surface 17 of the housing 14 is a cylindrical electrically conductive coil 20 having a pair of conductor leads 21, 22 passing through apertures (not shown) in the housing 14 to the exterior thereof.

Also secured within recess 15 are a pair of cylindrical permanent magnets 30, 40 in mutually opposing magnetic relation. Upper magnet 30 produces a generally toroidal upper magnetic field indicated by broken lines 31, 32 which follows an upper internal magnetic path within the housing 14 extending from the upper (north) pole face 33, outwardly and downwardly through housing 14, and radially inwardly through coil 20 to lower (south) pole face 35 of magnet 30.

Lower magnet 40 produces a generally toroidal magnetic field which extends downwardly from lower (north) pole face 41 of magnet 40, radially outwardly along the coupling surface 16 in the region exterior to housing 14, upwardly through sidewall portions of housing 14, and radially inwardly through coil 20 to upper (south) pole face 43 of magnet 40.

Lower (north) pole face 41 of lower magnet 40 is recessed inwardly of the plane of contact surface 16 to avoid direct contact with a structural member 12 whenever the sensor 10 is adhered to the surface of the structural member.

In use, sensor 10 is adhered to the surface of the associated structural member 12 in the following manner. If structural member 12 is fabricated from a magnetizable material, sensor 10 self-adheres to the member 12 by virtue of the magnetic coupling therebetween. If structural member 12 is not fabricated from a magnetizable material, the sensor 10 may be magnetically adhered thereto by simply securing a thin sheet of magnetizable material (12' in FIG. 2) to the contacting surface of member 12. In this mode of operation, flexural vibration of member 12 causes the gap δ between the lower pole surface 41 and the upper surface of member 12 (or layer 12') to vary, which varies the reluctance of the magnetic path presented to the lower magnetic field. This causes the strength of the magnetic field passing through coil 20 from below to vary, which results in the generation of an electrical current which is directly proportional to the velocity of the flexural vibration. The signals appearing on external leads 21, 22 are then coupled to a suitable measuring instrument, such as an amplifier and galvanometer.

The device of FIG. 1 may also be used to measure the acceleration of the flexural vibration of a member 12 which is fabricated from a non-magnetizable electrically conductive material, such as aluminum. This is accomplished simply by measuring the same output current signals present on external leads 21, 22. In the case of a non-magnetizable structural member 12, the coil signals are proportional to the acceleration of the vibration, due to the interaction of the lower magnetic field with the non-magnetizable material present in member 12: This interaction causes the generation of eddy currents J within member 12. The eddy currents produce a resulting magnetic field B' which interacts with the lower magnetic field B produced by the sensor 10 in such a manner that the field strength variations sensed by coil 21 are directly proportional to acceleration, rather than velocity. This may be expressed mathematically as:

$$V = \frac{d\phi}{dt} = A\frac{dB'}{dt} = kA\Gamma B\ddot{\delta}$$

where
V = voltage induced in coil 21
φ = net flux through coil 21 = (B − B')·A
A = area of coil 21
k = constant of proportionality
J = eddy current in structural member 12
Γ = constant of proportionality
$\ddot{\delta}$ = second time derivative of the distance δ

$B' = KJ$ $J = \Gamma(B \times \delta)$

FIG. 2 shows an alternate embodiment of the invention employing electromagnets. As seen in this figure, a central cylindrical block 51 fabricated from an easily magnetizable material is provided with longitudinally spaced electromagnetic coils 52, 53 symmetrically arranged with respect to block 51 and sensing coil 20. Each electromagnetic coil 52, 53 is provided with a pair of power leads 54, 55, respectively, extending through housing 14 to the exterior of the sensor. Electromagnetic coils 52, 53 may be operated in the DC mode, and the operation is substantially identical to that described above with reference to FIG. 1. However, the strength of the magnetic fields produced in the embodiment of FIG. 2 may be varied to change the range of the output signals produced by the sensing coil 20. In addition, electromagnetic coils 52, 53 may be excited by a random noise signal to establish the resonant frequencies of the mechanical combination of sensor 10 and structural member 12. Further, electromagnetic coils 52, 53 may be operated in the AC mode to null out from the signal produced by sensing coil 20 any troublesome electrical disturbances, such as 60 Hz noise signals.

It should be noted that the sensor of either FIGS. 1 or 2 may be tuned to respond to different frequencies by varying the dimensions of the contact points A, B. Thus for example, tuning may be accomplished by varying the diameter of housing 14 in accordance with the vibrational frequencies of interest. Alternatively, the sensor 10 may be used in conjunction with the adaptor shown in FIGS. 3 and 4 to achieve frequency tuning, particularly for low frequencies of vibration (large wave lengths).

With reference to FIGS. 3 and 4, the sensor adaptor includes an elongate rigid support 61 to the lower surface of which the sensor 10 is adhered in the manner noted above. Straddling sensor 10 are a pair of support elements 62, 63, each illustrated as a transverse cylindrical rod. The sensor 10-adaptor assembly is secured to structural member 12 by means of rubber bands 65 which are passed over the opposing ends of each rod 62, 63 and underneath the structural member 12. Each rod 62, 63 provides line contact support for the adaptor-sensor assembly on the upper surface of structural member 12. As will be apparent to those skilled in the art, rods 62, 63 may be replaced with other equivalent support elements, such as knife edges, a plurality of point contacts or the like. As best illustrated in FIG. 3, the effect of rods 62, 63 is to lengthen the distance 1 between the effective points of contact between sensor 10 and structural member 12. The stiffness (i.e., the ratio of height between support 61 and the structural member 12 to the length 1 between contact points) should be substantially greater than the stiffness of the structural member 12 for best results. Operation of the device of FIG. 3, however, is substantially identical to that described above.

Once installed, the sensor 10 and structural member 12 form a combined structural element, and it is thus highly desirable to obtain initial response signals after installation. This may be achieved using one of the following techniques.

Firstly, a known force may be applied to the structural member 12 at a predetermined point, e.g., by dropping a known weight from a known height on the element 12 (or the sensor 10). Alternatively, the transfer function between any two points on structural member 12 may be obtained by means of a small hammer having a transducer attached thereto, this technique proceeding by simply striking the structural member 12 at the predetermined points and obtaining the ratio of the output signals from sensing coil 20 and the hammer transducer. Alternatively, the signals generated by sensing coil 20 in response to the flexural vibration of structural member 12 may be simply compared with those produced by a calibrated different sensor, such as the flexural rigidity sensor disclosed in my co-pending U.S. patent application Ser. No. 864,427 filed Dec. 27, 1977 for "Flexural Rigidity Sensor".

Sensors fabricated according to the invention may be used in a wide variety of applications. Such sensors may be used, for example, to measure the flexural vibration (either velocity or acceleration) of structural beams in a building; to detect acoustic bursts in mine structures; to measure the acoustic emission of structural members for potential fatigue; to measure the combustion internal pressure and vibrational frequency of an internal combustion engine. Other applications will occur to those skilled in the art.

While the above provides a full and complete disclosure of the preferred embodiments of the invention, various modifications, alternate constructions and equivalents may be employed without departing from the true spirit and scope of the invention. Therefore, the above description and illustrations should not be construed as limiting the scope of the invention which is defined by the appended claims.

What is claimed is:

1. A sensor for measuring the flexural vibration of an associated structural member, said sensor comprising;
    a magnetizable housing having a top, side walls and a bottom, the inner surfaces of said top and said side walls defining an interior volume, said bottom defining a peripheral contact surface, said top and said side walls providing an internal magnetic path;
    electrically conductive sensing coil means secured within said housing in said interior volume, said sensing coil means having an inner diameter;
    first and second magnetic field generating means secured in said interior volume centrally of said sensing coil means inner diameter for generating first and second opposing magnetic fields, said first magnetic field generating means having one pole positioned adjacent the inner surface of said top and the other pole positioned within said sensing coil means inner diameter so that said first magnetic field extends from said one pole upwardly into said top, outwardly to said side walls, downwardly within said side walls and radially through said sensing coil means to said other pole;
    said second magnetic field generating means having one pole positioned adjacent said bottom and recessed within said interior volume and the other pole positioned within said sensing coil means inner diameter so that said second magnetic field extends from said one pole downwardly to the exterior of said housing, outwardly to said peripheral contact surface, upwardly within said side walls and radially through said sensing coil means to said other pole, the facing poles of said first and second magnetic generating means having the same polarity and being mutually spaced; and
    pole piece means positioned between said facing poles and said inner diameter of said sensing coil means for providing a magnetic field path for the radially directed first and second magnetic fields, whereby variations in the strength in that portion of said magnetic field in the region exterior to said housing caused by flexural vibration of said associated structural member when said sensor is attached thereto are sensed by said electrically conductive coil means.

2. The combination of claim 1 wherein said housing and said coil are both cylindrical with a common axis of symmetry.

3. The combination of claim 1 wherein said first and second magnetic field generating means comprises a pair of permanent magnets arranged with common poles mutually opposed.

4. The combination of claim 1 wherein said first and second magnetic field generating means comprise paired mutually opposed electromagnets.

5. The combination of claim 1 wherein said housing, said coil means and said first and second magnetic field generating means all have cylindrical geometry with a common axis of symmetry.

6. The combination of claim 1 further including an elongate adaptor member adhered to said housing, said adaptor member having a pair of longitudinally spaced suspension contacts straddling said sensor and each adapted to contact said associated structural member when attached so that said suspension contacts function as the peripheral contact surface of the sensor, and means for enabling said adaptor member to be secured to said associated structural member.

7. The combination of claim 6 wherein the stiffness of said adaptor means is substantially greater than the stiffness of said associated structural member.

* * * * *